United States Patent
Chindamo et al.

(10) Patent No.: US 7,321,999 B2
(45) Date of Patent: Jan. 22, 2008

(54) METHODS AND APPARATUS FOR PROGRAMMING AND OPERATING AUTOMATED TEST EQUIPMENT

(75) Inventors: Domenico Chindamo, Rome (IT); Ariadne Salagianis, Bethlehem, PA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 273 days.

(21) Appl. No.: 10/959,857

(22) Filed: Oct. 5, 2004

(65) Prior Publication Data

US 2006/0075317 A1 Apr. 6, 2006

(51) Int. Cl.
*G01R 31/28* (2006.01)
(52) U.S. Cl. .................................... 714/726
(58) Field of Classification Search ............. None
See application file for complete search history.

(56) References Cited

U.S. PATENT DOCUMENTS

| | | | | |
|---|---|---|---|---|
| 5,157,781 A * | 10/1992 | Harwood et al. | ............ | 714/30 |
| 5,243,603 A * | 9/1993 | Broeren | ............ | 714/738 |
| 5,270,642 A * | 12/1993 | Parker | ............ | 714/727 |
| 5,323,108 A * | 6/1994 | Marker et al. | ............ | 324/158.1 |
| 5,475,815 A * | 12/1995 | Byers et al. | ............ | 714/32 |
| 5,995,731 A * | 11/1999 | Crouch et al. | ............ | 716/4 |
| 6,393,594 B1 * | 5/2002 | Anderson et al. | ............ | 714/738 |
| 6,591,211 B1 * | 7/2003 | Schnarch | ............ | 702/108 |
| 6,609,222 B1 * | 8/2003 | Gupta et al. | ............ | 714/733 |
| 2004/0230870 A1 * | 11/2004 | Wang et al. | ............ | 714/30 |

OTHER PUBLICATIONS

Peter Wohl, Effective Diagnostics through Interval Unloads in a BIST Environment, Jun. 10-14, 2002, Effective diagnostics through interval unloads in a BIST environment, Wohl, P.This paper appears in: Design Automation Conference, 2002. Proceedings. 39th, pp. 249-254.*
M. Nourani et al., "Testing High-Speed SoCs Uisng Low-Speed ATEs", May 2, 2002, 6 pages.
Synopsys, Inc., "Physical Scan Synthesis—1-Pass Physical Scan Ordering Technology Backgrounder", Oct. 2001, 7 pages.
Synopsys, Inc., "Hierarchical Scan Synthesis Methodology Using Test Models—High-Capacity/Performance Scan Synthesis Technology Backgrounder", Oct. 2001, 7 pages.
Davide Apello, et al., "Leveraging P1450.6 for faster production test development—Core Test Language (CTL) dramatically improved manufacturing test", 2003, 7 pages.
Synopsys, Inc., "DFT Complier SoCBIST Deterministic Logic BIST—Technolgy Backgrounder", Sep. 2002, 7 pages.
Synopsys, Inc., "DFT Complier SoCBIST Deterministic Logic BIST", Sep. 2002, 2 pages.
Agilent Technologies, Inc. "Reducing Cost of Test Through DFT", 2003, 2 pages.

* cited by examiner

*Primary Examiner*—Cynthia Britt
*Assistant Examiner*—Steven D. Radosevich

(57) ABSTRACT

In one embodiment, an electronic device is tested using automated test equipment (ATE) by 1) storing different vectors of scan load data in memory of the ATE; 2) storing a scan unload subroutine in the memory of the ATE; 3) stimulating the electronic device by retrieving the different vectors of scan load data and applying them to the electronic device; and 4) capturing responses to the different vectors by repeatedly calling the scan unload subroutine, and in response thereto, storing different vectors of scan unload data in the memory.

13 Claims, 2 Drawing Sheets

METHODS AND APPARATUS FOR PROGRAMMING AND OPERATING AUTOMATED TEST EQUIPMENT

BACKGROUND

Circuit test can generally be divided into two classes: functional and structural. With functional test, a test engineer and/or software 1) emulates the stimuli and responses that a circuit might receive/generate at its inputs and outputs during normal use, 2) applies the stimuli to the circuit's inputs, 3) captures responses to the stimuli at the circuit's outputs, and 4) compares the captured responses to the expected responses. With structural test, a circuit's intended function has little or no bearing on the generation of circuit tests. Rather, a circuit is provided with a plurality of storage elements that are linked to form a scan chain about a combinational logic "core". A circuit test pattern is then shifted into the storage elements; the pattern is launched into the logic core; and a response to the test pattern is then captured via the elements of the scan chain. The captured response is then shifted out of the storage elements and compared to an expected response. By exercising the logic core using a variety of test patterns, one can infer that the structure of the logic core is present and appropriately connected. If the structure of the logic core is present and appropriately connected, one can then infer that it should function as designed. Structural test is therefore advantageous in that one need not emulate nor understand a circuit's function, but need only exercise its logic.

A circuit that is designed for structural test will typically comprise "design-for-test" (DFT) structures. In a simple case, DFT structures may only comprise a plurality of storage elements that are linked to form a scan chain. In more complex cases, DFT structures may comprise storage elements that are linked in multiple scan chains; or DFT structures may comprise built-in self-test (BIST) hardware that 1) generates scan patterns internally to a device under test, and 2) optionally collects responses to scan patterns and compresses them into one or more output signatures.

SUMMARY OF THE INVENTION

In one embodiment, a method for testing an electronic device using automated test equipment (ATE) comprises storing different vectors of scan load data, as well as a scan unload subroutine, in memory of the ATE. The electronic device is then stimulated by retrieving the different vectors of scan load data and applying them to the electronic device. Responses to the different vectors are then captured by 1) repeatedly calling the scan unload subroutine, and in response thereto, 2) storing different vectors of scan unload data in the memory.

In another embodiment, a method is provided for capturing a response from an electronic device having BIST hardware. The BIST hardware has a production test mode and a diagnostic test mode, and the electronic device outputs one or more response signatures in production test mode and outputs raw response data in diagnostic test mode. In production test mode, the method uses ATE to 1) capture said response signatures, and 2) compare said response signatures to expected response signatures. In diagnostic test mode, the method uses the ATE to repeatedly call a scan unload subroutine such that the scan unload subroutine causes raw response data to be captured from the ATE without a comparison of the raw response data to expected response data.

In yet another embodiment, apparatus comprises computer-readable media, and data stored on the computer-readable media. The data comprises a diagnostic mode, different vectors of scan load data, and a scan unload subroutine. The data also comprises program code to read the diagnostic mode and, if the diagnostic mode is set, cause ATE to stimulate an electronic device by retrieving the different vectors of scan load data and applying them to the electronic device. The data further comprises program code to read the diagnostic mode and, if the diagnostic mode is set, cause the ATE to capture responses to the different vectors by 1) repeatedly calling the scan unload subroutine, and in response thereto, 2) storing different vectors of scan unload data.

Other embodiments are also disclosed.

BRIEF DESCRIPTION OF THE DRAWINGS

Illustrative and presently preferred embodiments of the invention are illustrated in the drawings, in which.

DETAILED DESCRIPTION OF AN EMBODIMENT

One DFT structure that may be incorporated into a circuit, and in particular, a system-on-a-chip (SOC), is a deterministic BIST structure, such as the DBIST structure offered by Synopsis, Inc. (of Mountain View, Calif., USA).

Figure 1:
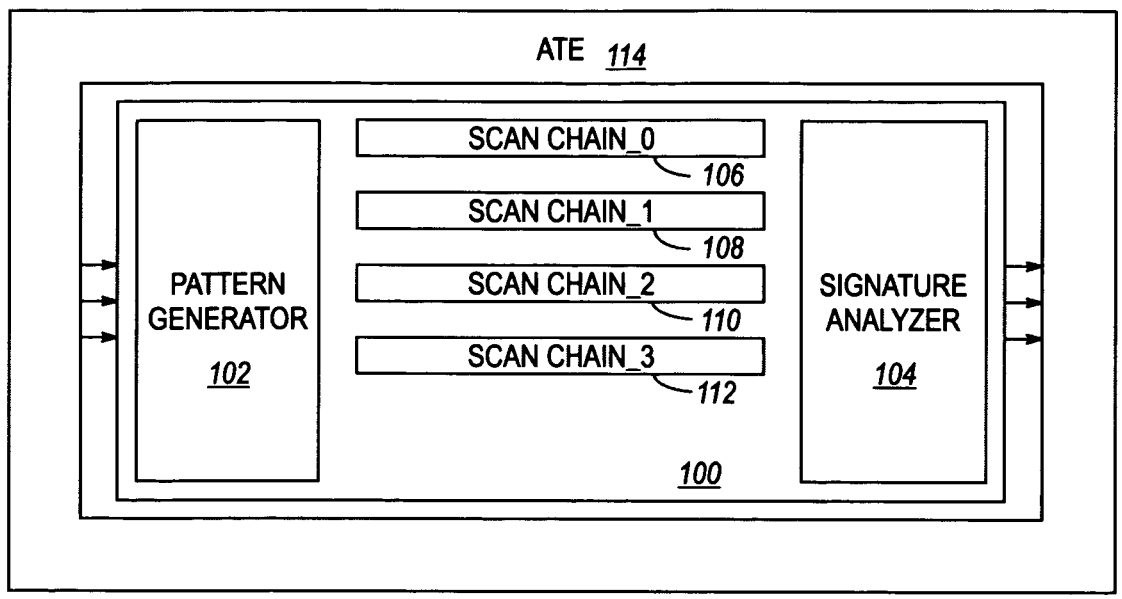
FIG. 1 illustrates an exemplary system-on-a-chip (SOC) incorporating BIST hardware, as well as automated test equipment for testing the SOC.

An SOC 100 incorporating a deterministic BIST structure is shown in FIG. 1. By way of example, the deterministic BIST structure comprises a pattern generator 102 and a signature analyzer 104. Coupled between the pattern generator 102 and signature analyzer 104 are a plurality of scan chains 106, 108, 110, 112. In use, an externally generated scan "seed" (i.e., a seed provided by ATE 114) is provided to the pattern generator 102. The pattern generator 102 then uses the seed as a basis for generating a plurality of scan patterns, which are then shifted into the various scan chains 106-112. After launching the patterns from the scan chains 106-112, responses to the patterns are captured via the scan chains 106-112 and shifted to the signature analyzer 104. With deterministic BIST, the signature analyzer 104 may comprise a multiple-input shift register (MISR) that is capable of converting hundreds of thousands of shifted bits into a 128-bit signature.

A deterministic BIST structure may be capable of operating in several modes, including a production test mode and a diagnostic test mode. In the production test mode, an SOC's scan chains 106-112 are coupled between the deterministic BIST pattern generator 102 and signature analyzer 104, as shown in FIG. 1. In the diagnostic test mode, the SOC's scan chains 106-112 are coupled to the pattern generator 102, but decoupled from the signature analyzer 104 (i.e., their outputs bypass the signature analyzer 104). Thus, in diagnostic test mode, raw response data can be acquired from the scan chains 106-112. This raw response data can then be analyzed in greater detail external to the SOC 100.

Typically, deterministic BIST hardware 102, 104 will be placed in the production test mode during a "first pass" of scan testing. During this first pass, failing scan intervals (i.e., groups of scan patterns) are identified. During a second pass, the deterministic BIST hardware 102, 104 may be placed in the diagnostic test mode, and the scan patterns of the failing intervals may be re-run.

In production test mode, deterministic BIST provides significant memory savings to the ATE 114 that 1) provides the seeds to the deterministic BIST pattern generator 102, and 2) captures the signatures from the signature analyzer 104 and compares them to expected signatures. In fact, in the case of Synopsis' DBIST, Synopsis indicates that a 100,000 bit scan pattern can be encoded as a 500 bit seed, thus reducing the memory requirements for both stimulating a device under test 100, and for comparing a captured response to an expected response, by a factor of forty. This makes it possible for the memory (or memories) of ATE 114 to effectively store many more vectors of scan load data than was previously possible. For example, in lieu of a single scan load pattern, ATE 114 might be able to store a plurality of seeds representing forty scan load patterns. The same is true for scan unload patterns.

Figure 2:
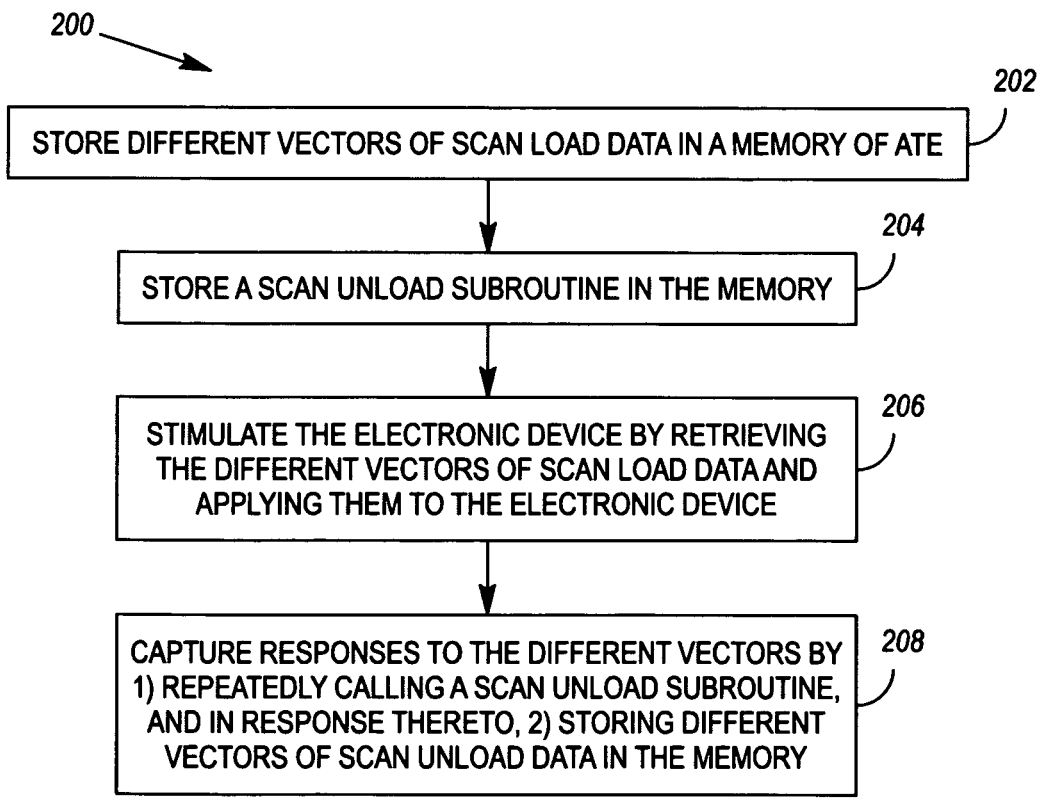
FIG. 2 illustrates an exemplary method for testing an electronic device using automated test equipment (ATE)

In diagnostic test mode, deterministic BIST continues to provide a memory savings for scan load patterns, but not scan unload patterns. That is, in diagnostic test mode, enough memory must be reserved for unloading and comparing raw response data (i.e., uncompressed scan data). If a test engineer and/or software is not careful, it is conceivable that ATE memory limitations could be exceeded during deterministic BIST's diagnostic test mode. In the past, this has led to the generation of different patterns (or sets of patterns), and the loading and unloading of different patterns to manage memory usage when large numbers of failing scan patterns are encountered. However, the loading and unloading of different scan patterns is time consuming and error prone, and not well-suited to a production test environment. FIG. 2 therefore illustrates a novel method 200 for testing an electronic device using ATE.

In accordance with the method 200, different vectors of scan load data are stored 202 in memory of the ATE, along with a scan unload subroutine 204. Thereafter, the electronic device is stimulated 206 by retrieving the different vectors of scan load data and applying them to the electronic device. Responses to the different vectors are then captured 208 by 1) repeatedly calling the scan unload subroutine, and in response thereto, 2) storing different vectors of scan unload data in the memory. In this manner, scan data is unloaded from the device without compare, and ATE memory requirements for unloading scan data may be reduced by orders of magnitude. If the method 200 is applied to a device comprising BIST hardware such as deterministic BIST, the method 200 may be executed while the BIST hardware is placed in a diagnostic mode (i.e., when the BIST hardware is configured to output raw response data).

Note that "memory of the ATE" is herein construed to cover both a unified memory structure, or a distributed or function-specific memory structure. For example, the 93000 SOC Tester offered by Agilent Technologies, Inc. (of Palo Alto, Calif.) comprises a memory structure that is divided into per-pin vector and sequencer memories for respectively storing vector and sequencer (i.e., program instructions) for each pin of the 93000 SOC Tester.

Deterministic BIST hardware may be designed to load a plurality of scan patterns in series. In fact, Synopsis' DBIST loads a series of scan patterns arranged in intervals of thirty-two patterns each. When testing such a device, a single scan unload subroutine may be shared across multiple patterns and intervals.

Figure 3:
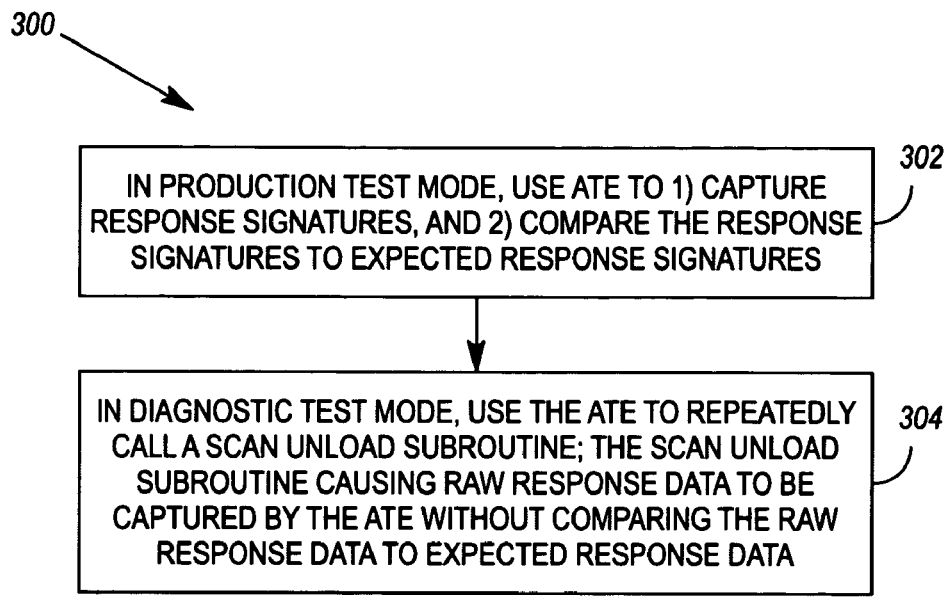
FIG. 3 illustrates an exemplary method for capturing a response from an electronic device having BIST hardware.

By way of example, FIG. 3 illustrates a method 300 for capturing a response from an electronic device having BIST hardware such as deterministic BIST. In a production test mode, the method 300 uses ATE to 1) capture 302 response signatures from BIST hardware, and 2) compare 302 the response signatures to expected response signatures. Then, in a diagnostic test mode, the method 300 uses the ATE to repeatedly call 304 a scan unload subroutine. In turn, the scan unload subroutine causes raw response data to be captured from the BIST hardware, without a comparison of the raw response data to expected response data.

Figure 4:
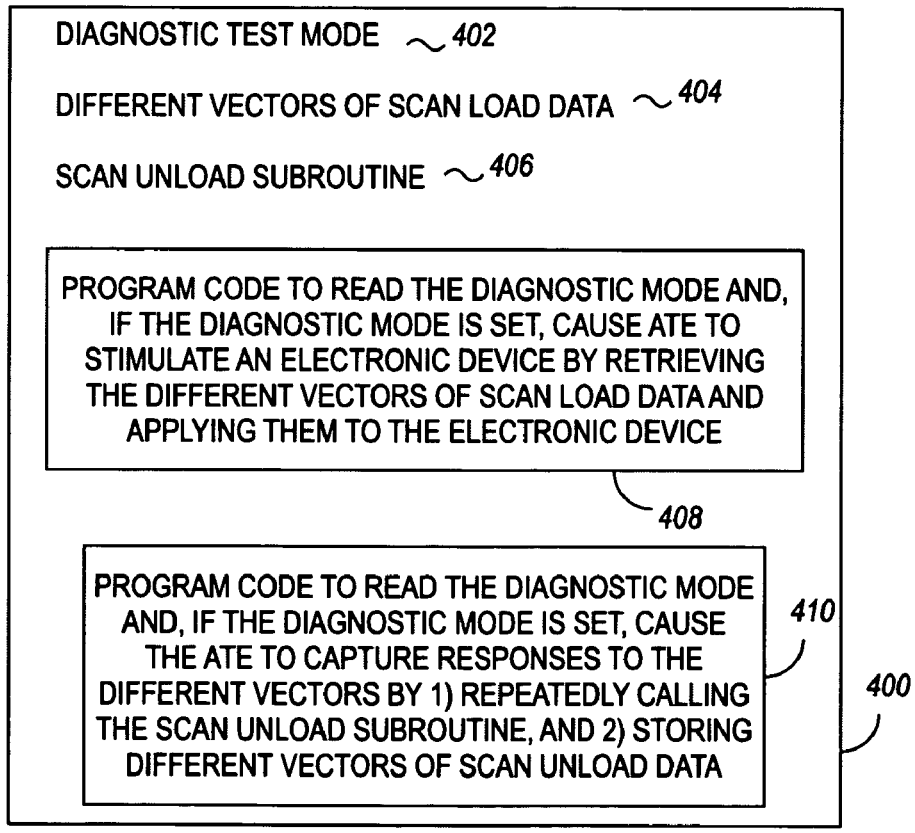
FIG. 4 illustrates exemplary data that may be stored on computer-readable media to cause execution of a method such as that which is illustrated in FIG. 2 or 3.

Either of the above methods 200, 300, including variants thereof, may be embodied in data stored on computer-readable media 400 such as a memory or disk (whether fixed or removable). See FIG. 4. In such a case, the data stored on the computer-readable media may comprise 1) a diagnostic mode 402, 2) different vectors of scan load data 404, and 3) a scan unload subroutine 406. The data may also comprise program code 408 to read the diagnostic mode 402 and, if the diagnostic mode is set, cause ATE to stimulate an electronic device by retrieving the different vectors of scan load data 404 and applying them to the electronic device. The data may further comprise program code 410 to read the diagnostic mode 402 and, if the diagnostic mode is set, cause the ATE to capture responses to the different vectors by 1) repeatedly calling the scan unload subroutine 406, and 2) storing different vectors of scan unload data.

When applied to Agilent's 93000 SOC Tester, the above-described methods 200, 300 and apparatus 400 can reduce vector and sequencer memory requirements by a factor of N*M, where N represents the number of intervals of patterns stored in memory and M represents the number of pattern loops within an interval.

What is claimed is:

1. A method for testing an electronic device using automated test equipment (ATE), comprising:
    storing different vectors of scan load data in memory of the ATE;
    storing a scan unload subroutine in the memory;
    stimulating the electronic device by retrieving the different vectors of scan load data and applying them to the electronic device; and
    capturing responses to the different vectors by i) repeatedly calling the scan unload subroutine, and in response thereto, ii) storing different vectors of scan unload data in the memory.

2. The method of claim 1, wherein the vectors of scan load data correspond to a single scan load pattern.

3. The method of claim 1, wherein the vectors of scan load data correspond to multiple patterns of scan load data.

4. The method of claim 1, wherein the vectors of scan load data correspond to multiple intervals of patterns of scan load data.

5. The method of claim 1, wherein the electronic device comprises built-in self-test (BIST) hardware having a production test mode and a diagnostic test mode; wherein the electronic device outputs one or more response signatures in production test mode and outputs raw response data in diagnostic test mode; and wherein said method is executed while the BIST hardware of said electronic device is in said diagnostic test mode.

6. The method of claim 1, wherein the ATE is a system-on-a-chip (SOC) tester.

7. A method for capturing a response from an electronic device having built-in self-test (BIST) hardware, the BIST hardware having a production test mode and a diagnostic test mode, and the electronic device outputting one or more response signatures in production test mode and outputting raw response data in diagnostic test mode, the method comprising:
  in production test mode, using automated test equipment (ATE) to i) capture said response signatures, and ii) compare said response signatures to expected response signatures; and
  in diagnostic test mode, using the ATE to repeatedly call a scan unload subroutine, said scan unload subroutine causing raw response data to be captured by the ATE without comparing the raw response data to expected response data.

8. The method of claim 7, wherein the ATE is a system-on-a-chip (SOC) tester.

9. Apparatus, comprising:
  computer-readable media; and
  data, stored on the computer-readable media, comprising:
    a diagnostic mode;
    different vectors of scan load data;
    a scan unload subroutine;
    program code to read the diagnostic mode and, if the diagnostic mode is set, cause automated test equipment (ATE) to stimulate an electronic device by retrieving the different vectors of scan load data and applying them to the electronic device; and
    program code to read the diagnostic mode and, if the diagnostic mode is set, cause the ATE to capture responses to the different vectors by i) repeatedly calling the scan unload subroutine, and in response thereto, ii) storing different vectors of scan unload data.

10. The apparatus of claim 9, wherein the vectors of scan load data correspond to a single scan load pattern.

11. The apparatus of claim 9, wherein the vectors of scan load data correspond to multiple patterns of scan load data.

12. The apparatus of claim 9, wherein the vectors of scan load data correspond to multiple intervals of patterns of scan load data.

13. The apparatus of claim 9, wherein the ATE is a system-on-a-chip (SOC) tester.

* * * * *